United States Patent [19]

Medley, Jr. et al.

[11] 4,030,001
[45] June 14, 1977

[54] CO-PLANAR LEAD CONNECTIONS TO MICROSTRIP SWITCHING DEVICES

[75] Inventors: Max W. Medley, Jr.; James H. Ward, Jr., both of Largo, Fla.

[73] Assignee: E-Systems, Inc., Dallas, Tex.

[22] Filed: Nov. 19, 1975

[21] Appl. No.: 633,344

[52] U.S. Cl. ............................. 361/401; 333/84 M
[51] Int. Cl.² ...................................... H05K 1/04
[58] Field of Search ................. 333/84 M, 84 R; 317/101 R, 101 C, 101 CP; 29/626; 174/52 S, 68.5

[56] References Cited

UNITED STATES PATENTS

| 2,890,395 | 6/1959 | Lathrop et al. | 317/101 CP |
| 3,328,730 | 6/1967 | Dowdell, Jr. | 333/84 R |
| 3,517,272 | 6/1970 | Lee et al. | 333/84 M |

Primary Examiner—David Smith, Jr.
Attorney, Agent, or Firm—Robert V. Wilder

[57] ABSTRACT

A method and apparatus are disclosed for providing co-planar connections to the terminal leads of a switching device from circuit elements located on opposite sides of a planar microstrip substrate. A through hole is provided in the substrate where the switching device is to be mounted. A conductive terminal is inserted through the hole. The terminal includes a portion contacting the circuit element on one side of the substrate and a portion extending through the hole to become substantially co-planar with the circuit elements on the opposite side of the substrate. A switching device is positioned in the hole to permit its leads to be connected to the extended portion of the terminal and to the microstrip circuit elements on the opposite side of the substrate.

9 Claims, 3 Drawing Figures

U.S. Patent  June 14, 1977  4,030,001
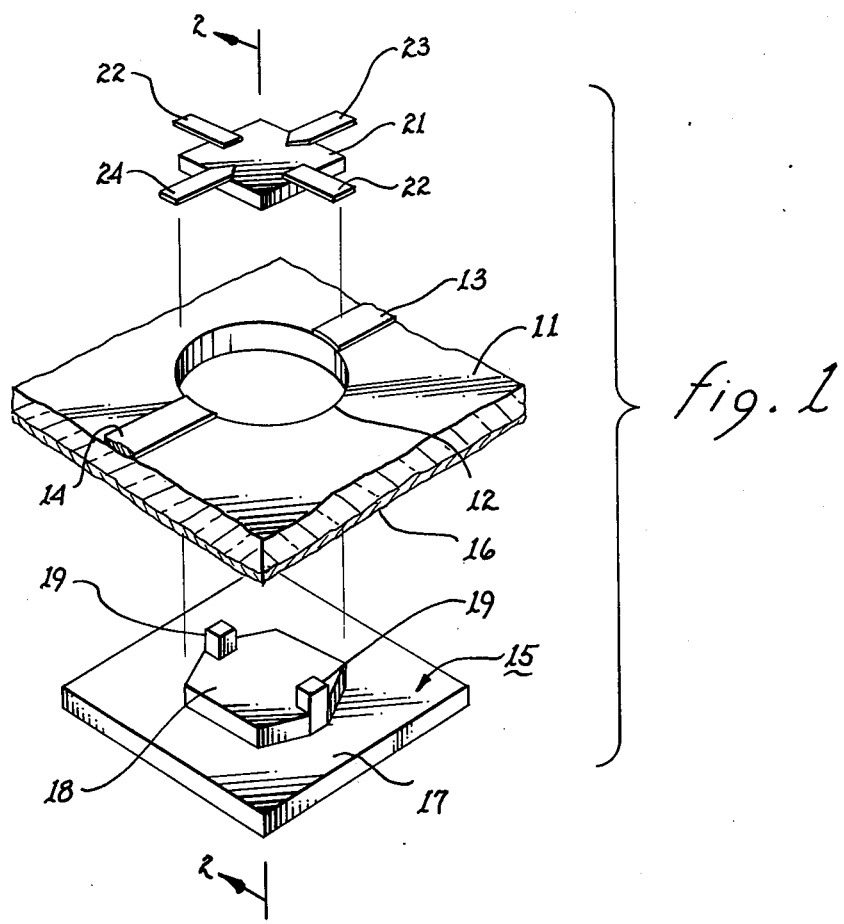
fig. 1
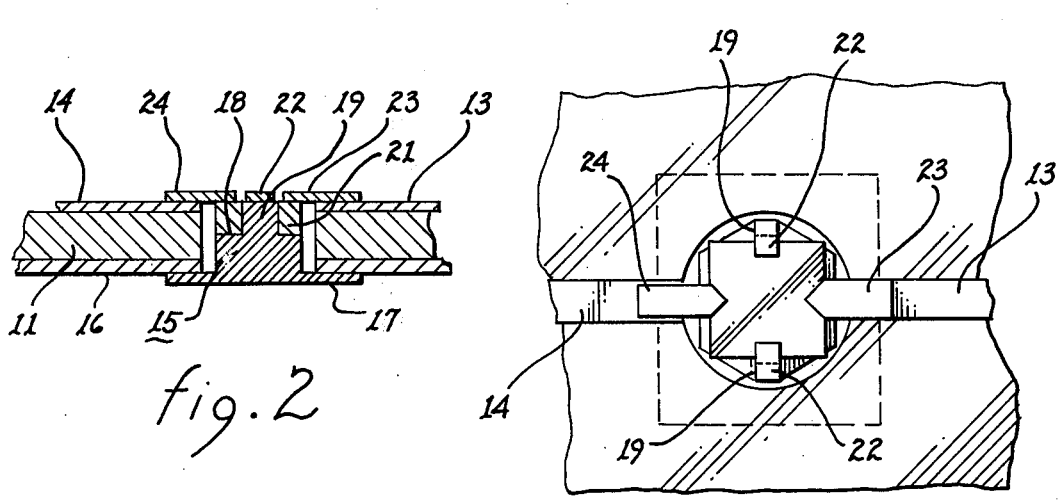
fig. 2
fig. 3

CO-PLANAR LEAD CONNECTIONS TO MICROSTRIP SWITCHING DEVICES

BACKGROUND OF THE INVENTION

This invention was made in the course of, or under a contract or subcontract, with the Department of the Navy.

This invention relates to the connection of switching device leads to a planar microstrip, and more particularly, where all connections to the switching device leads are co-planar with respect to each other.

At microwave frequencies, the lead length between a switching device and the circuit element to which it connects is directly related to generation of an undesirable inductance. For example, a transistor connected to a planar microstrip circuit will have significant emitter inductance if the lead length is not kept extremely short. The presence of emitter inductance substantially increases the noise figure and reduces the transistor gain. Because the ground plane of a planar microstrip substrate is on the reverse side of the substrate from the input and output transmission lines, existing connection schemes require the ground connection to be made at the package with long leads connecting to the input and output transmission lines, or require the input and output leads to be connected at the package edge with long leads extending to the ground plane. Neither approach is satisfactory because the long leads introduce substantial and undesirable lead inductance.

Present mounting methods attempt to minimize the lead lengths by mounting the switching device in a hole through the substrate. Although lead lengths are reduced by this method, they remain longer than desirable. This method is also unsatisfactory because the presence of a hole through the substrate creates a discontinuity due to distortion in the altered vector field. The discontinuity generates undesirable circuit parasitics. A mounting method that extends the ground plane up through the mounting hole to become co-planar with the input and output transmission lines would simultaneously minimize induced circuit parasitics due to the discontinuity while minimizing lead impedance by permitting connection to each terminal lead directly at the edge of the switching device package.

Various attempts have been made to extend the ground plane to be co-planar with the input and output transmission lines. Such attempts have included plating a conductive strip from the ground plane to the upper substrate surface via a plated through hole. Other attempts have utilized conductive members, such as rivets, which are inserted through a hole in the substrate to contact the ground plane and extend it to the upper substrate surface. These attempts have been unsatisfactory not only because they are costly, but also they have not produced reliable connections that can be repeatedly fabricated with a high percentage yield. Prior art references worthy of note include: U.S. Pat. Nos. 3,786,375 (Sato, et al.), 3,864,727 (Schoberl) and 3,869,677 (Belohoubek, et al.).

OBJECT OF THE INVENTION

It is an object of this invention to provide a method and apparatus for connecting a switching device to a planar microstrip circuit with minimum lead impedance.

It is another object of this invention to provide a method and apparatus for extending the ground plane of a planar microstrip circuit to become co-planar with the input and output transmission lines and to permit all connections to a switching device to be co-planar with each other and to be made at the device package edge.

It is yet another object of this invention to provide a method and apparatus for minimizing discontinuity generated circuit parasitics present in planar microstrip circuits.

It is also an object of this invention to provide a method and apparatus for utilizing the ground plane of a planar microstrip circuit as a heat sink.

It is a further object of this invention to provide a method and apparatus for reliably connecting a switching device to a planar microstrip circuit at low cost with high repeatability.

The foregoing and other objects, features and advantages of this invention will be apparent from the following detailed description of the illustrative embodiment of the invention, as shown in the accompanying drawings.

SUMMARY OF THE INVENTION

Briefly stated, and in accordance with one embodiment of this invention, these objects are accomplished by placing a through hole in the microstrip substrate where it is desired to connect the switching device. A conductive terminal is inserted through the hole to contact the substrate ground plane and extend the plane through the hole to become co-planar with the transmission lines on the opposite surface of the substrate. The switching device package is then inserted into the hole and appropriate connections between device leads and the ground plane and transmission lines are made at the package edge.

BRIEF DESCRIPTION OF THE DRAWINGS

FIG. 1 is an exploded perspective view of a switching device connected to a planar microstrip substrate in accordance with this invention.

FIG. 2 is a cross-sectional view of the assembly of FIG. 1 taken along line 2—2.

FIG. 3 is a plan view of the assembled connection shown in FIG. 1.

DETAILED DESCRIPTION OF THE ILLUSTRATIVE EMBODIMENT

The advantages and features of the present invention are best illustrated by the embodiment shown in FIG. 1. The assembly of a switching device package 21 with a microstrip substrate 11 should be accomplished with the minimum length of lead between the terminal leads of the device package and the points of connection on the substrate. If switching device package 21 is a transistor, the terminal leads would include a pair of emitter leads 22, a base lead 23 and a collector lead 24. Microstrip substrate 11 is fabricated with an input line 13 and an output line 14 affixed to the top surface of the substrate. A conductive ground plane 16 is affixed to the bottom surface of substrate 11. Lead 13, lead 14 and ground plane 16 may be affixed to the substrate utilizing a variety of well known techniques, such as electro-depositing. Substrate 11 is fabricated with a through hole 12 extending through the substrate and ground plane 16; hole 12 also separates input lead 13 and output lead 14.

The assembly of transistor 21 with substrate 11 is effectively accomplished utilizing a conductive terminal 15. Conductive terminal 15 includes a flat base 17 which is larger than through hole 12. Centrally located on base 17 is a mounting saddle 18 which is smaller than through hole 12. Extending upward from saddle 18 are a pair of upright contact posts 19. The distance separating the pairs of contact posts 19 is sufficient to permit transistor 21 to be positioned on saddle 18 and between the posts.

Terminal 15 is assembled with substrate 11 by inserting saddle 18 into through hole 12. Base 17 of terminal 15 is thereby positioned against ground plane 16 of substrate 11, as seen in FIG. 2. Base 17 is connected electrically and mechanically to ground plane 16 by any of a variety of common methods, for example, by parallel-gap soldering. With terminal 15 assembled to substrate 11 through the bottom of hole 12, substrate 11 is ready to be assembled with transistor 21.

Transistor 21 is inserted through the top of hole 12 to be positioned on saddle 18 between posts 19 of terminal 15. As is clearly seen in FIG. 2, the upper surfaces of posts 19 are co-planar with the upper surface of input lead 13 and output lead 14. As a result, the connections between input lead 13 and base lead 23, between output lead 14 and collector lead 24, and between posts 19 and emitter leads 22 may all be made co-planar with each other. Terminal 15 acts to extend ground plane 16 through posts 19 to the perimeter of package 21. As a result, the distance between the terminal leads from transistor package 21 and the appropriate connection point on substrate 11 is minimized. Accordingly, the gain of transistor 21 is maximized while the noise figure resulting from impedance in the leads is minimized. As with the connection between ground plane 16 and base 17, the connection between the terminal leads of transistor 21 and the appropriate connection on substrate 11 may be accomplished utilizing a variety of known techniques.

Because transistor package 21 is supported by saddle 18 of conductive terminal 15, terminal 15 also acts effectively as a heat sink to remove heat generated within package 21 by dissipating it through ground plane 16. To illustrate the size and material of a practical assembly if package 21 is 100 mils square, posts 19 would be approximately 115 mils apart from each other. Substrate 11 is 50 mils in thickness and is fabricated from alumina with metallized gold circuit elements. Terminal 15 is fabricated from copper to provide excellent thermal and electrical properties. Obviously, the dimensions and material implicated are illustrative only and many variations could be made to suit specific applications.

It can be readily appreciated that the above embodiment advantageously combines good thermal properties, good electrical properties and good mechanical properties, all within the same mounting configuration. Other combinations and modifications could be utilized by those skilled in the art without departing from the spirit and scope of this invention. For example, hole 12 could be fabricated with an elliptical opening to further reduce separation between package 21 and the transmission lines, base 17 could be fabricated with a circular plan configuration, or posts 19 could be replaced by a single upright contact, to illustrate just a few of the various modifications suitable for particular applications.

What is claimed is:

1. A method for assembling a switching device package having a plurality of terminal leads with a microstrip substrate having an input lead and an output lead on one surface of the substrate and a ground plane on the opposite surface of the substrate, said method comprising the steps of:
   a. providing a hole extending through said substrate to separate the input and output leads thereof;
   b. inserting a conductive member through the hole in said substrate;
   c. connecting said conductive member to the ground plane of said substrate;
   d. extending the ground plane of said substrate through said conductive member to become substantially co-planar with the one surface of said substrate;
   e. positioning said switching device on said conductive member and generally below the extended ground plane; and
   f. making co-planar connections from the terminal leads of said switching device package to the input and output leads and to said conductive member.

2. Apparatus for mounting a switching device package having a plurality of terminal leads, on a microstrip substrate, said apparatus comprising, in combination:
   a. a planar, non-conductive microstrip substrate having an upper surface and a lower surface, said substrate comprising
      i. an input lead affixed to the upper surface of said substrate;
      ii. an output lead affixed to the upper surface of said substrate and located spaced apart from, but co-planar with, said input lead;
      iii. a ground plane affixed to the lower surface of said substrate; and
      iv. means defining a hole larger than said switching device package extending through said substrate and said ground plane and positioned between said input lead and said output lead; and
   b. an electrically conductive terminal positioned in said hole in said substrate, said terminal comprising
      i. a base, larger than said hole, contacting said ground plane;
      ii. a saddle positioned in said hole and extending upwardly from said base for supporting said switching device package; and
      iii. a protrusion extending upwardly from said saddle and terminating substantially co-planar with said input lead and said output lead, whereby connections from said input lead, said output lead, and said upright post to the terminal leads of said switching device package are co-planar to each other.

3. Apparatus in accordance with claim 2, wherein said protrusion comprises
   a pair of upright posts spaced apart from each other and located at opposite ends of said saddle.

4. Apparatus in accordance with claim 2, wherein said electrically conductive terminal is fabricated from a thermally conductive material.

5. A microstrip transmission line comprising:
   a. a planar, non-conductive substrate comprising
      i. an input transmission line affixed to the upper surface of said substrate; p2 ii. an output transmission line affixed to the upper surface of said substrate and located spaced apart from, but co-planar with, said input line;
      iii. a ground plane affixed to the lower surface of said substrate; and iv. mounting means defining a hole extending through said substrate and said ground plane and positioned between said input line and said output line;
b. an electrically conductive member positioned in said hole, said member comprising
  i. a base, larger than said hole, contacting said ground plane;
  ii. a saddle positioned through said hole and extending upwardly from said base; and
  iii. a projection extending upwardly from said saddle and terminating substantially co-planar with said input line and said output line; and
c. a switching device package positioned in said hole and supported by said saddle, said switching device package comprising
  i. a first terminal lead connected to said input line;
  ii. a second terminal lead connected to said output line; and
  iii. a third terminal lead connected to said projection,
   whereby the connections to said first terminal lead, said second terminal lead and said third terminal lead are co-planar to each other.

6. A microstrip transmission line in accordance with claim 5, wherein said switching device package comprises
a semiconductor chip transistor.

7. A microstrip transmission line in accordance with claim 5, wherein said projection comprises
a pair of terminal posts spaced apart from each other and located at opposite ends of said saddle.

8. A microstrip transmission line in accordance with claim 5, wherein said saddle includes
a flat upper surface for supporting said switching device package.

9. A microstrip transmission line in accordance with claim 8, wherein said electrically conductive member is fabricated from thermally conductive material.

* * * * *